United States Patent [19]
Lee

[11] Patent Number: 5,901,091
[45] Date of Patent: May 4, 1999

[54] BI-DIRECTIONAL DATA INPUT/OUTPUT CIRCUIT OF A SYNCHRONOUS MEMORY DEVICE AND THE METHOD FOR CONTROLLING THE SAME

[75] Inventor: Jae Jin Lee, Kyoung-do, Rep. of Korea

[73] Assignee: Hyundai Electronics Industries Co., Ltd., Kyoungki-do, Rep. of Korea

[21] Appl. No.: 09/063,371

[22] Filed: Apr. 21, 1998

[30] Foreign Application Priority Data

Apr. 25, 1997 [KR] Rep. of Korea ................. 97-15595

[51] Int. Cl.$^6$ ............... G11C 16/04; G11C 7/02; G11C 8/00
[52] U.S. Cl. ................ 365/189.05; 365/189.08; 365/207; 365/233
[58] Field of Search ............ 365/189.05, 189.08, 365/190, 194, 205, 207, 208, 233

[56] References Cited

U.S. PATENT DOCUMENTS

| | | | |
|---|---|---|---|
| 5,278,789 | 1/1994 | Inoue et al. | 365/189.01 |
| 5,608,688 | 3/1997 | Park | 365/194 |
| 5,657,292 | 8/1997 | McClure | 365/233 |
| 5,742,544 | 4/1998 | Foss | 365/207 |
| 5,754,488 | 5/1998 | Suh | 365/205 |

*Primary Examiner*—Trong Phan
*Attorney, Agent, or Firm*—Gary M. Nath; Nath & Associates

[57] ABSTRACT

There is disclosed a bidirectional data input/output circuit of a synchronous memory device and the method for controlling the same according to the present invention. The synchronous memory device according to the present invention is aimed at solving a data confusion problem generated when a write operation subsequent to a data read operation is performed in a data input/output line. Though the data line is a bidirectional bus data line by which an input/output is also performed, it can be applied to a circuit construction in which high and low potential data are inputted/outputted through an independent dedicated line. In addition, there is provided an internal buffer for inputting a write data into the memory device. The circuit according to the present invention further includes a memory for storing a data signal generated upon a read operation, when a read operation subsequent in time to a write operation is performed; and a device for selecting as a write data the opposite signal of the data signal generated upon a read operation when the two data lines both become active.

6 Claims, 7 Drawing Sheets

BI-DIRECTIONAL DATA INPUT/OUTPUT CIRCUIT OF A SYNCHRONOUS MEMORY DEVICE AND THE METHOD FOR CONTROLLING THE SAME

BACKGROUND OF THE INVENTION

1. Field of the Invention

The present invention relates to a data input/output circuit of a synchronous memory device and the method for controlling the same. In particular, the present invention relates to a bi-directional data input/output circuit of a synchronous memory device and the method for controlling the same in which a sequence control is rapidly executed when performing a write command during a read operation in the case where read data and write data are transmitted on a single data line.

2. Description of the Prior Art

A data input/output circuit of a conventional synchronous memory device includes a data bus sense amplifier and a write data driver which are associated with data paths in a block, and a data input buffer and a data output buffer which are associated with an input/output operation of the entire data. Wirings, which transfer data signals between these circuits, that is block data-related circuits and global data-related circuits, are called data bus lines.

The prerequisite issues in designing these data bus lines involve the following methods: first, whether or not the data input/output lines will be wired individually or whether or not they will be used as a common line (bi-directional bus); second, in each of the above cases, whether or not high potential data and low potential data will be both transferred through a single data line (single-ended data bus method), or whether or not the data line for transmitting a single data will be implemented as two data lines so that one of the two data lines is used to transmit only a high potential signal and the one of the two data lines is used to transmit only a low potential signal (double-ended data bus method).

With respect to the above second method, an explanation will be given in more detail as follows. Typically, digital data becomes binary data; a high potential and a low potential. In other words, it determines whether or not to transmit the data on a single line simultaneously, that is, to transmit both the high potential and low potential on a single driving line simultaneously, or otherwise with a high potential-dedicated line and a low potential-dedicated line installed therein where the two lines are initialized to become an initial high potential (or initial low potential), or it determines whether or not to make the high potential-dedicated line become a low potential (or high potential) when transmitting the high potential and to make the low potential-dedicated line become a low potential (or high potential) when transmitting the low potential. The second decision is advantageous in a high speed operation but has a disadvantage in that it requires a lot of area for wiring data lines.

FIG. 1 shows a block structure of a bi-directional data input/output circuit of a synchronous memory device showing data paths in accordance with a conventional method. In FIG. 1, a block read data outputted from a memory device drives an input/output data bus line 101 through a data bus sense amplifier (db-sense amp. 102). Then, the data on the bus line is outputted to outside the memory device through a data output buffer 103 being a global read data receive section. Also, the data written from the outside of the memory device to the inside thereof drives an input/output data bus line 101 through a data input buffer 105 being a global write data driver. This is inputted to the internal of the memory device through an internal input buffer 104 within the memory device being a block data receive section.

A post charge logic 106 acts to recharge and then initialize the data line through a CMOS switching circuit, wherein a switching control signal is consisted to delay and generate a potential shift of the data line through a delay circuit.

However, in the data input/output circuit constructed as above, when a read operation and a write operation are performed, that is, the operations which begin at one clock in the read operation of a synchronous memory device may not be finished before a next clock signal is received, but there are cases where the operation is performed on more than one clock.

In this case, the time when the data signal generated by the read operation is carried onto a commonly used data line becomes the time after a next clock is received after the read command is received. Then, if commands in continually received next clocks are written thereto, the data signal inputted simultaneously with the write command will be rapidly carried onto the data line.

Accordingly, two data signals, that is, the data signal generated by the read operation and the write data signal for a write operation will be carried onto it simultaneously, thereby causing an erroneous operation. This phenomenon is more serious when the clock period is high.

In order to prevent such an erroneous operation, solutions are provided which limit the operation of the memory device to perform the write operation after the read operation is completely finished, or uses the data line used upon a read operation and the data line used upon a write operation, individually. However, the former sacrifices the speed in switching between the read operation and the write operation and the latter has a disadvantage in that it takes a lot of a chip area.

FIG. 2 is a drawing for explaining a minimum clock period for the bi-directional data input/output circuit of a synchronous memory device shown in FIG. 1. Referring to FIG. 2, in order for the continuous read-write operation to be properly operated, when the write command is performed in a next clock clkt2 during when the read operation is performed in clkt1, the conditions in which any erroneous operation is caused in a conventional circuit are as follows:

tclk+t3>t1+t2

That is, tclk>t1+t2−t3

(where, t1 indicates the time when the data signal generated upon the read operation is carried onto the data line, t1 indicates the pulse width of the data line, and t3 indicates the time when the data signal generated upon the write operation is carried onto the data line)

In other words, the continuous clock periods of the memory device are limited to the time called t1+t2−t3. More particularly, it is limited to one for t2 region to which current read data are being transmitted.

SUMMARY OF THE INVENTION

It is an object of the present invention to solve the problems involved in the prior art, and to provide a bi-directional data input/output circuit of a synchronous memory device and the method for controlling the same in which a previous data signal is stored on a bi-directional data path circuit so that a sequence control is rapidly executed when performing a write command during a read operation in the case where a read data and a write data are transmitted on a single data line.

In order to achieve the above object, according to the present invention, first, a read data driving device operates in a state where a write operation subsequent to a read operation is continually performed, while the write command is inputted in a state where the device for re-initializing a read data signal (post charge logic, 106) is not yet initiated. Next, in the case that a write data is generated, the write data driving device is unconditionally operated.

In this case, (a) if the read data and the write data are the same, the signal transmitted onto the data line is used as a write data signal, (b) if the write data is different from the read data, two data lines consisting of a high potential-dedicated data line and a low potential-dedicated data line are in a normal state. In this case, there is provided a device for storing the read data previously transmitted thereto, so that the opposite signal of the read data is used as a write data signal. In other words, it makes use of the fact that each of the two data lines has the information on the signals each of which are transmitted by them, within the outside and inside of the memory device, respectively.

The method of controlling the data line input/output line comprises the steps of: during the time when a write operation subsequent to a read operation is continuously performed, if a write command is inputted when a read data driving apparatus is performed, a write data is generated, unconditionally driving a write data driving apparatus; if the write data and the read data are quite different, storing a pre-transmitted read data; and selecting the opposite signal of the read data as a write data signal. Also, it uses the signal transmitted onto the data line as a write data signal if the read data and the write data are same to each other, after the step of unconditionally driving the write data driving apparatus.

In addition, it comprises the step of delaying a read data re-initialization longer than a normal mode in response to a write command if said write command is inputted during the time when the read data driving apparatus is performed.

According to the present invention, in a synchronous memory device, a data input/output circuit of said synchronous memory device comprises a first data line for transmitting a read data upon a read operation, and transmitting a write data upon a write operation but only high potential data; a second data line for transmitting a read data upon a read operation, and transmitting a write data upon a write operation but only low potential data; a data output buffer connected to a first end of said first and second data lines, for outputting a data signal transmitted onto the data line upon a read operation; a data input buffer connected to said first end of said first and second data lines, for driving said first and second data lines as a write data upon a write operation; a data bus sense amplifier connected to a second end of said first and second data lines, for driving a read data; an internal input buffer connected to said second end of said first and second data lines, for inputting the write data into the memory device; and a post charge logic connected to said first and second data lines, for initializing the data lines after some delay after the data lines become active; said internal input buffer includes a memory for storing a data signal generated upon a read operation when a write operation is performed continually in time during a read operation; and a device for selecting as a write data, the opposite signal of the data signal generated upon a read operation when the two data lines both become active.

Also, the post charge logic further comprises an additional delay circuit for delaying a read data re-initialization for longer than a normal mode in response to a write command if the write command is inputted during the time when the read data driving apparatus is performed.

Additionally, the internal input buffer comprises: a first delay circuit connected to said first data line; a second delay circuit connected to said second data line; a feedback latch circuit consisting of a first NOR circuit inputting the output of said first delay circuit and said second data line as inputs and a second NOR circuit inputting the output of said second delay circuit and said first data line as inputs; third and fourth NOR circuits each connected to the output on said first and second NOR circuits of said latch circuit and to said first and second data lines; and first and second NOR circuits to which a write command signal and the output of said third and fourth NOR circuits is each inputted.

BRIEF DESCRIPTION OF THE DRAWINGS

The above object, and other features and advantages of the present invention will become more apparent by describing the preferred embodiment thereof with reference to the accompanying drawings, in which.

DETAILED DESCRIPTION OF PREFERRED EMBODIMENTS

Below, one preferred embodiment of the present invention will be explained in detail by reference to the accompanying drawings.

Figure 1:
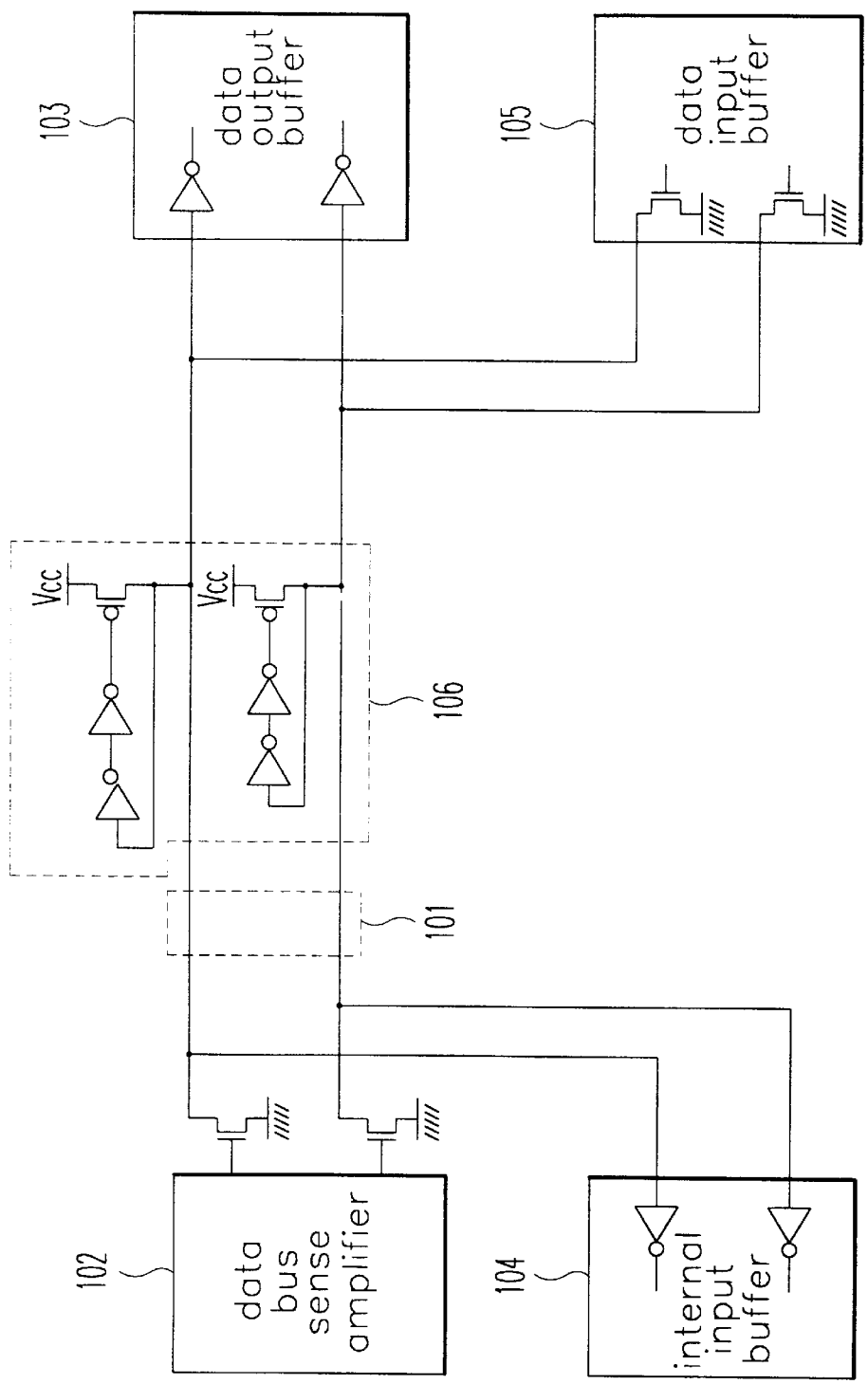
FIG. 1 is a block diagram for showing a conventional data input/output circuit of a synchronous memory device illustrating data paths.
Figure 2:
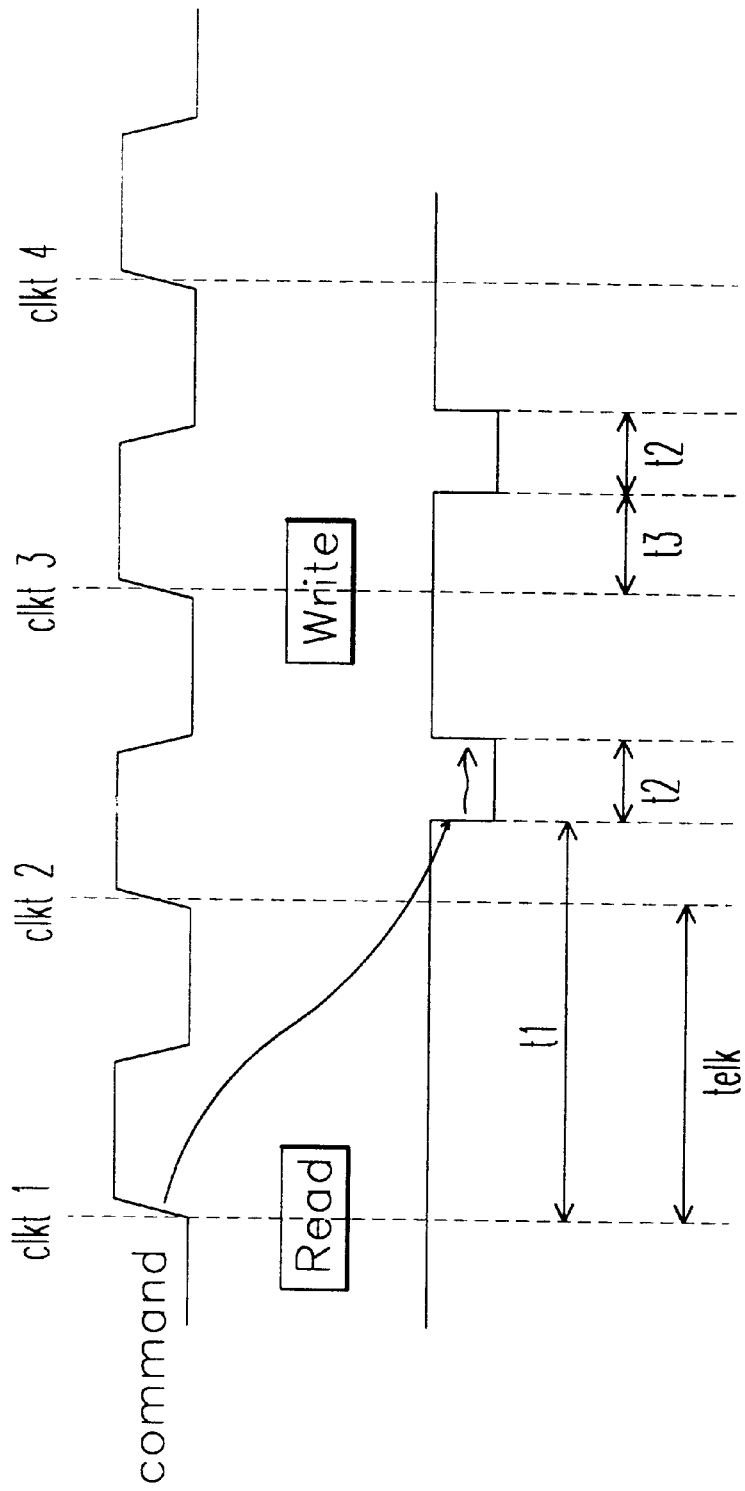
FIG. 2 is an operational timing diagram for illustrating minimum clock periods of FIG. 1.
Figure 3:
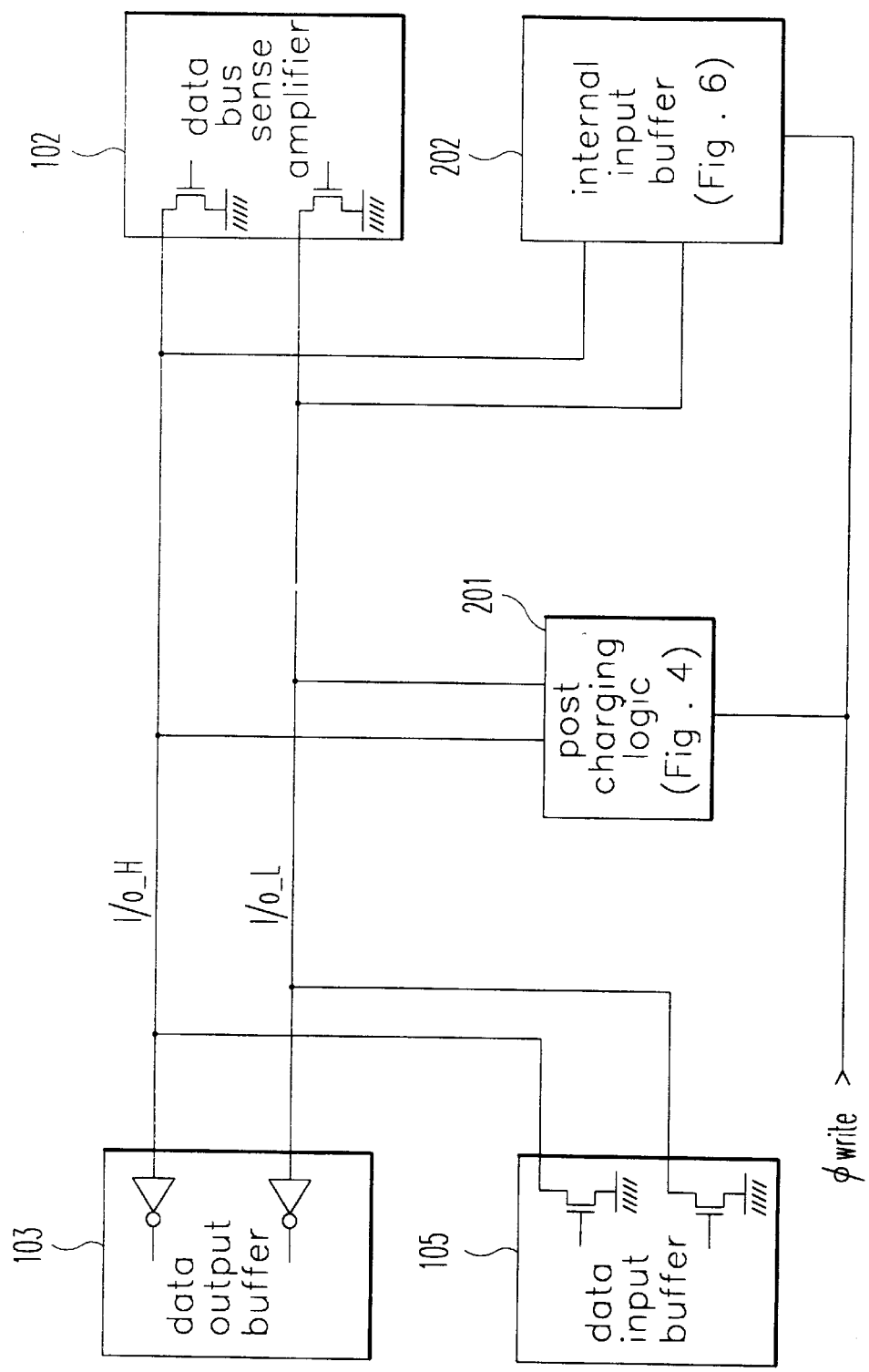
FIG. 3 is a block diagram for showing a bi-directional data input/output circuit of a synchronous memory device illustrating data paths according to one embodiment of the present invention.

FIG. 3 is a block diagram illustrating an input/output circuit according to one embodiment of the present invention. The components same to those in the system shown in FIG. 1 are given same reference numbers and the explanation thereof will be omitted herein. In FIG. 3, the components different from the conventional synchronous memory device shown in FIG. 1 are the internal input buffer 202 being the write data receive section and the post charging logic circuit 201.

Figure 4:
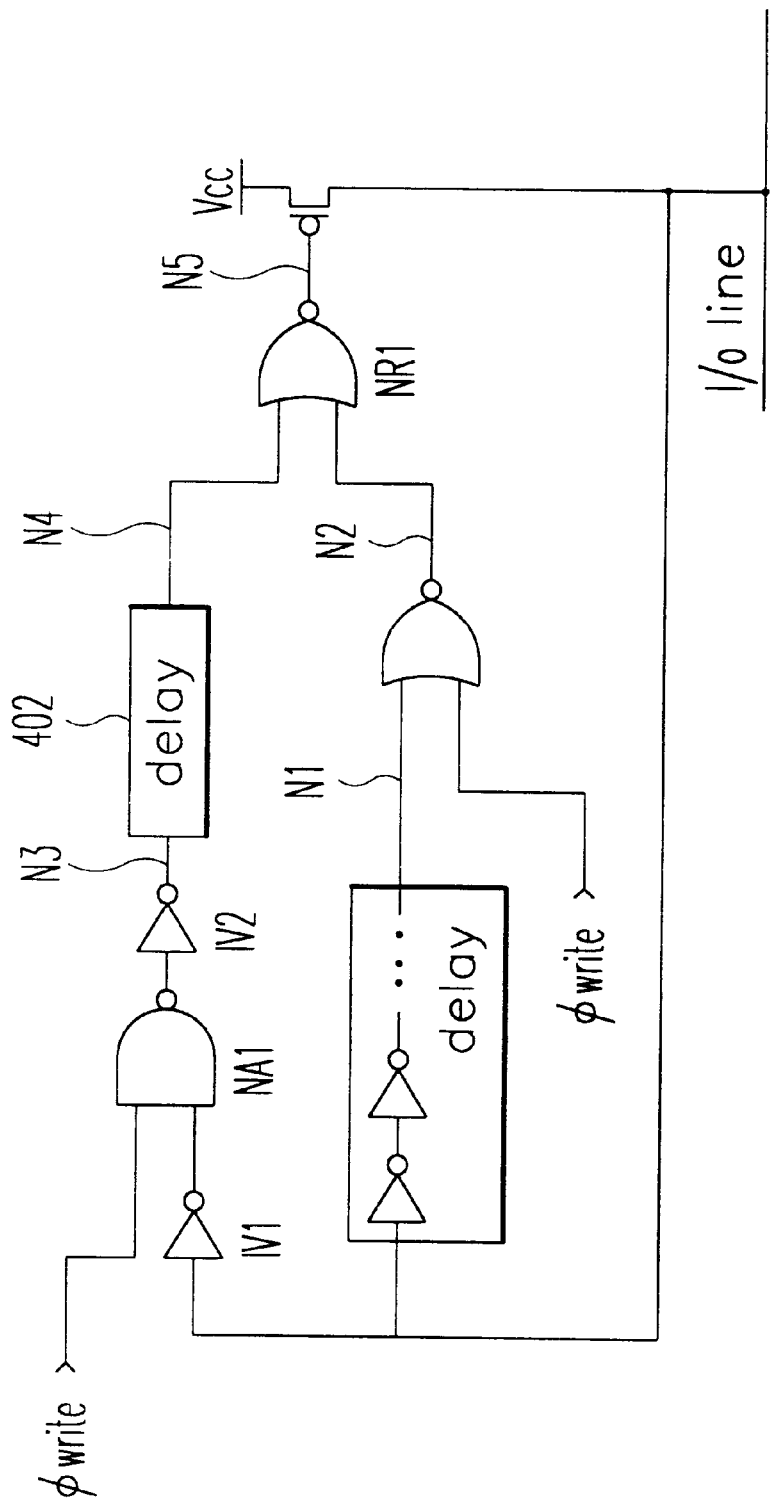
FIG. 4 shows a circuit diagram illustrating one embodiment of a post charging logic circuit shown in FIG. 3.

FIG. 4 is a circuit diagram illustrating one embodiment of the post charging logic circuit shown in FIG. 3. Compared to the conventional data paths shown in FIG. 1, the circuit shown in FIG. 4 comprises a write operation detection section NA1 and an additional delay circuit 402 in additional to the recharging paths which are the same as those in the conventional circuit shown in FIG. 1. NAND gate NA1 receives inputs from a write command signal and inverter IV1. The output from NA1 is received by inverter IV2 which produces an output at node N3 which goes through a first delay circuit 402 for the first input to NOR gate NR1 at node N4. The same signal used as an input for IV1 is used as an input for a second delay circuit which produces a first input to a NOR gate at node N1 and is combined with a write command signal for the second input to the NOR gate. The NOR gate produces an output at node N2 which is used as the second input to NOR gate NR1. The output of NR1 is connected to a transistor at node N5 producing an output to the I/O line, an input for the first delay circuit through inverter IV1, and also an input for the second delay circuit. Accordingly, it should be noted that the circuit shown in FIG. 4 can provide an extended delay signal compared to the conventional recharging paths which can not. Therefore, the post charging logic circuit in FIG. 3 extends the pulse width for the input/output data of the data line upon detection of a write operation.

Another essential component of the present invention is the internal input buffer 202 for generating a write data signal by using the data from two data lines, in the case where data is carried onto the two data lines when the write operation is performed continually in time after the read operation is initiated, and which will be explained in detail by reference to FIGS. 5 and 6.

Figure 5:
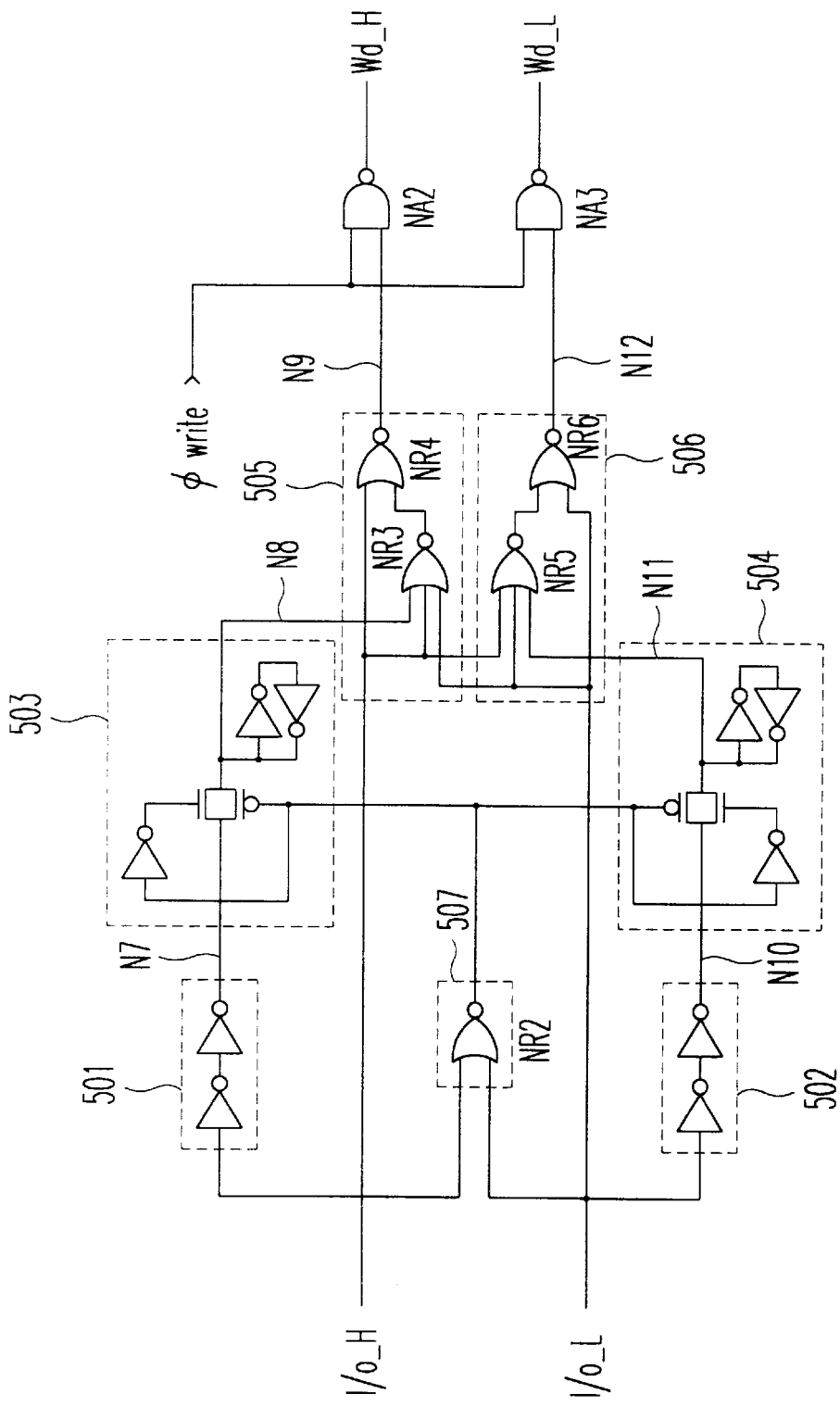
FIG. 5 illustrates an operational concept of an internal input buffer shown in FIG. 3.

FIG. 5 illustrates an operational concept of the internal input buffer 202 shown in FIG. 3. In FIG. 5, the read data memory 503 and the read data memory 504 receive an input from delay circuit 501 at node N7 and an input from delay circuit 502 at node N10 respectively. The read data memory 503 and 504 store the data when the read operation is performed. The write data selecting section 505 and 506 selects as a write data signal, the opposite signal of the signal generated upon the read operation in case that data signals are both carried onto two data lines. Selecting section 505 comprising NOR gates NR3 and NR4 receive inputs from read data memory 503, I/o_H and I/o_L through NOR gate NR3. The output of NOR gate NR3 provides a first input to NOR gate NR4 and I/o_H provides the second input to NOR gate NR4. NAND gate NA2 receives a write command signal which is used as the first input to NAND gate NA2 and the output of NOR gate NR4 of selection section 505 at node N9 is used as the second input to NAND gate NA2. The output of NAND gate NA2 produces the Wd_H signal. Similarly, selecting section 506 comprising NOR gates NR5 and NR6 receive inputs from read data memory 504, I/o_H and I/o_L through NOR gate NR5. The output of NOR gate NR5 provides a first input to NOR gate NR4 and I/o_H provides the second input to NOR gate NR6. NAND gate NA3 receives a write command signal which is used as the first input to NAND gate NA3 and the output of NOR gate NR6 of selection section 506 at node N12 is used as the second input to NAND gate NA3. The output of NAND gate NA3 produces the Wd_L signal. The delay circuit 501 located at the front end of the read data memory 503 is provided to store the state before the data signals are both carried onto the two data lines I/O_H, I/O_L in case that the data signals are both carried onto the two data lines. The active sense section NR2 of circuit 507 senses the state where the data singals are both carried onto the two data lines and then it controls the read data memories 503 and 504 using the data signal upon the previous read operation stored. Thus, if there is any data signal carried onto the data line when a previous read operation is performed, the inverted signal thereof is written as a write signal. However, if there is no any data when the previous read operation is performed, the signal generated is written as a write signal.

For example, when a high potential signal is transmitted upon a read operation, the data line for high potential I/O_H becomes an active state (low potential) and the data line for low potential I/O_L reaches a wait state (high potential). In this state, if a write operation by which a low potential signal is transmitted is consecutively performed, both the data lines I/O_H, I/O_L reach a low state. At that moment, the output signal N6 of the active sense section NR2 sensing that both the data lines are at a low potential, is outputted, the read data memory 503 on the line side through which the read data is transmitted outputs a low potential signal N8, but the read data memory 504 on the line side in which there was no data upon the read operation outputs a high potential signal N11. This signal is outputted to the write data select portion 505, which then output a low potential to the output N9 on the data line for high potential I/O_H and a high potential to the output N11 on the data line for low potential I/O_L, in response to the memory data. Then, after some delay, if a write control command is inputted thereto, though the first two common data lines are both at low potential, a high potential is outputted to the output wd-h on the data line for high potential I/O_H and a low potential is outputted to the output wd-I on the data line for low potential I/O_L as final output data, thereby a desired low signal write command can be performed.

Figure 7:
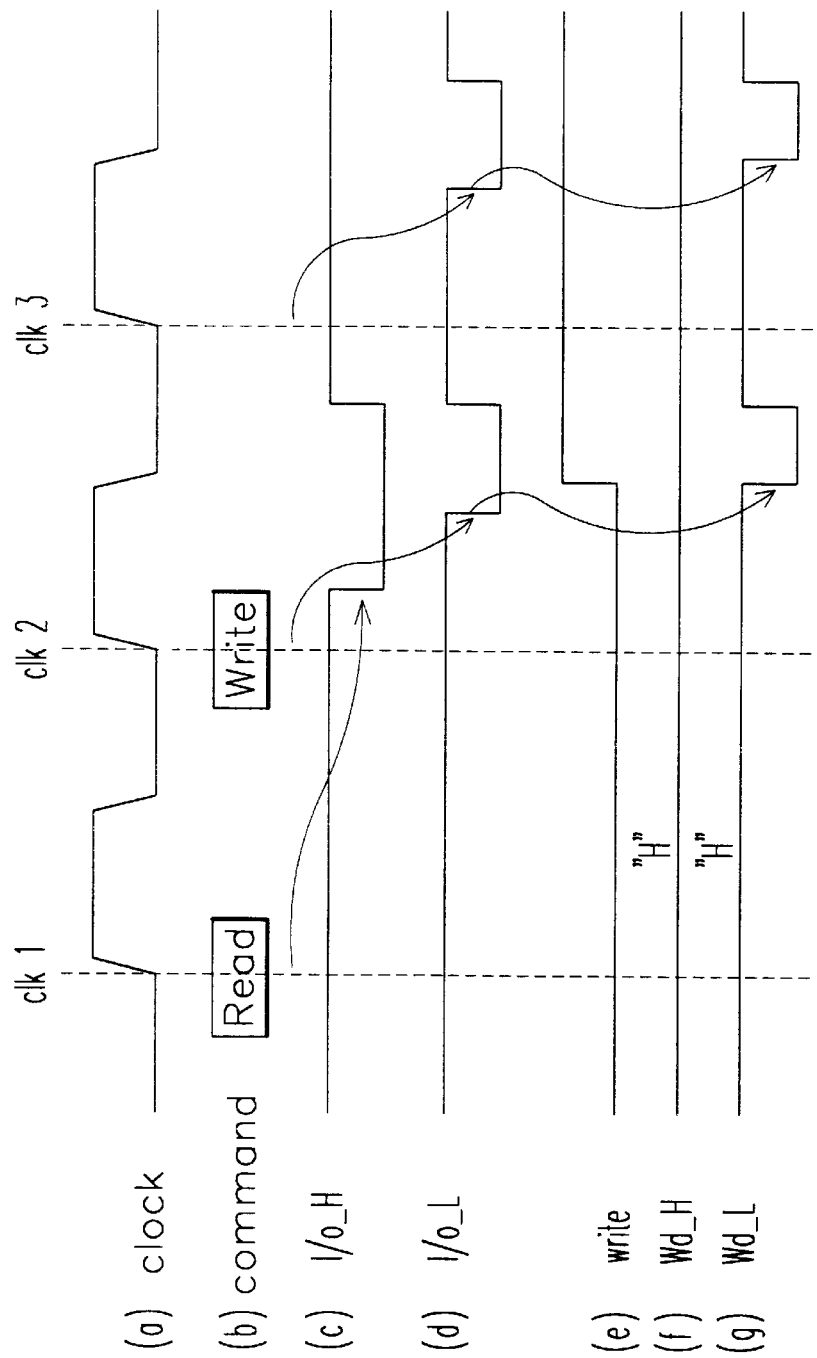
FIGS. 7a–7g are timing diagrams for showing an operation of FIG. 3.

FIG. 7 is a timing diagram showing the operation of the internal input buffer 202 shown in FIG. 3, as explained above.

Figure 6:
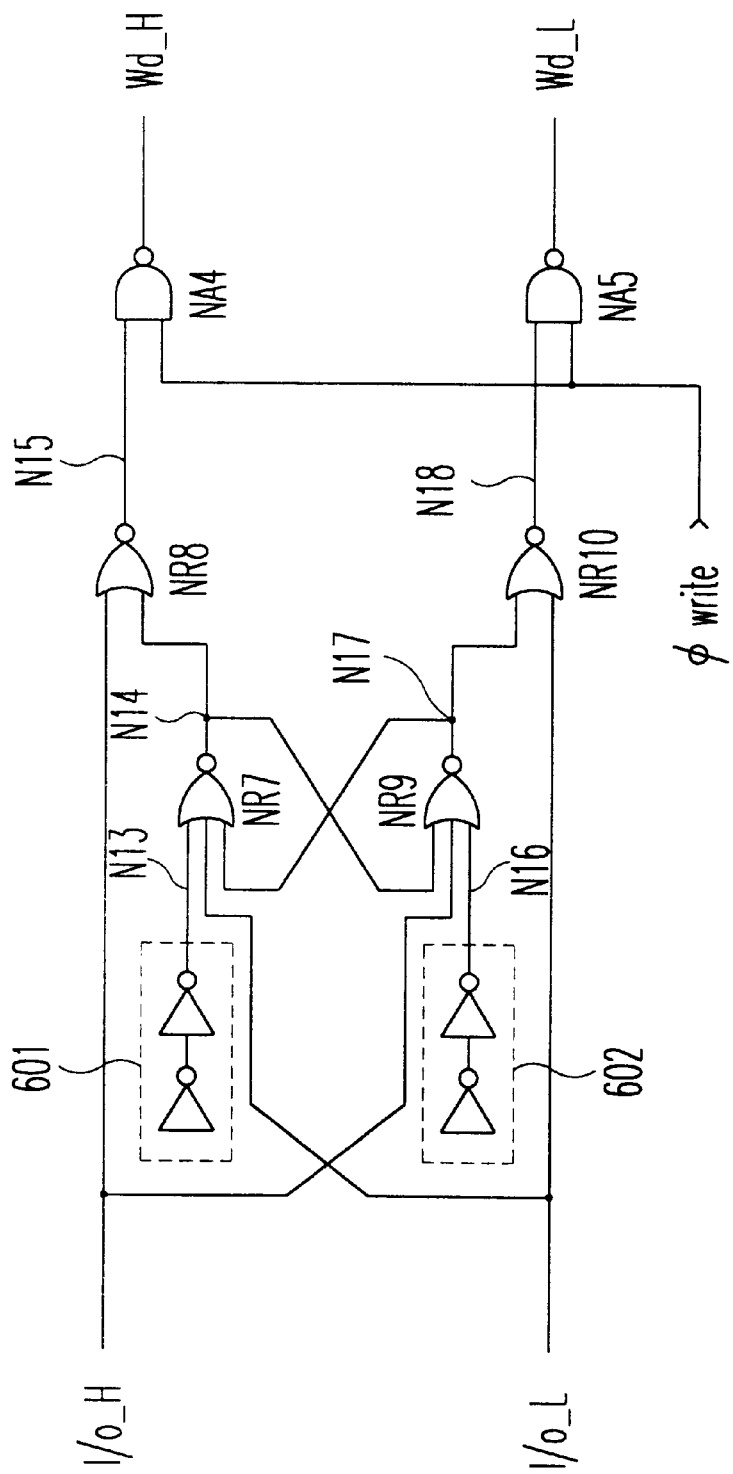
FIG. 6 is a circuit diagram illustrating one embodiment of the internal input buffer shown in FIG. 3.

FIG. 6 is a circuit diagram illustrating one embodiment of the internal input buffer 202 shown in FIG. 3, which illustrates the construction for storing previous data when the data is carried onto both the two data lines described above in reference to FIG. 5 and for selecting opposite signals when a write operation is performed, into which a latch circuit is incorporated. The latch circuit is a flip flop comprising a first NOR gate NR7 and a second NOR gate NR9. The inputs of NOR gate NR7 are connected to delay circuit 601, I/o_L and node N17. The inputs of NOR gate NR8 are connected to the output of NR7 at node N14 and I/o_H. The output of NR8 and the write command signal are connected to the inputs of NAND gate NA4 which produces a Wd_H signal. Similarly, the inputs of NOR gate NR9 are connected to delay circuit 602, I/o_H and node N14. The inputs of NOR gate NR10 are connected to the output of NR9 at node N17 and I/o_H. The output of NR10 and the write command signal are connected to the inputs of NAND gate NA5 which produces a Wd_L signal. The operation thereof is the same as that shown in FIG. 5. That is, the active sense section NR2 in FIG. 5 is automatically performed within the delay circuit and the latch circuit in FIG. 6. In response to the result of the active sense, a write data select operation is performed at the NOR circuit NR8, NR10.

While the present invention has been described and illustrated herein with reference to the preferred embodiment thereof, it will be understood by those skilled in the art that various changes in form and details may be made therein without departing from the spirit and scope of the invention. For example, comparing FIGS. 5 and 6, the construction of the read data memories 503, 504 or the write data select sections 505, 506 can be independently implemented and can be implemented simply using a CMOS circuit.

From the foregoing, the bi-directional bus of the present invention in which a data path is performed on a common line provides the advantage in that it can solve the data transfer error occurring at data lines in which a high/low potential data are inputted/outputted through an independent dedicated line without loss in response speed of the entire memories or consumption of a specific chip area.

What is claimed is:

1. A method of controlling the data of a synchronous memory device through a bidirectional data line for a high and a low potential input/output, comprising the steps of:

during the time when a write operation subsequent to a read operation is continuously performed, if a write command is inputted when a read data driving apparatus is performed, unconditionally driving a write data driving apparatus if a write data is generated;

storing pre-transmitted read data, if the write data and the read data are quite different; and, selecting the opposite signal of the read data as a write data signal.

2. A method of controlling the data of a synchronous memory device as claimed in claim 1, comprising the step of using the signal transmitted onto the data line as a write data signal if the read data and the write data are the same as each other, after the step of unconditionally driving the write data driving apparatus.

3. A method of controlling the data of a synchronous memory device as claimed in claim 1, comprising the step of delaying a read data re-initialization for longer than a normal mode in response to a write command if said write command is inputted during the time when the read data driving apparatus is performed.

4. In a synchronous memory device, data input/output circuit of said synchronous memory device, comprising:

a first data line for transmitting read data upon a read operation, and transmitting write data upon a write operation but only high potential data;

a second data line for transmitting read data upon read operation, and transmitting a write data upon write operation but only low potential data;

a data output buffer connected to a first end of said first and second data lines, for outputting a data signal transmitted onto the data line upon a read operation;

a data input buffer connected to said first end of said first and second data lines, for driving said first and second data lines as a write data upon a write operation;

a data bus sense amplifier connected to a second end of said first and second data lines, for driving a read data;

an internal input buffer connected to said second end of said first and second data lines, for inputting the write data into the memory device; and a post charge logic connected to said first and second data lines, for initializing the data lines after some delay after the data lines become active;

said internal input buffer includes a read data memory for storing a data signal generated upon a read operation when a write operation is performed continually in time during a read operation; and a device for selecting as write data the opposite signal of the data signal generated upon a read operation when the two data lines both become active.

5. A data input/output circuit as claimed in claim 4, wherein said post charge logic further comprises an additional delay circuit for delaying a read data re-initialization more than a normal mode in response to a write command if the write command is inputted during the time when the read data driving apparatus is performed.

6. A data input/output circuit as claimed in claim 4, wherein said internal input buffer comprises:

a first delay circuit connected to said first data line;

a second delay circuit connected to said second data line;

a feedback latch circuit consisted of a first NOR circuit inputting the output of said first delay circuit and said second data line as inputs and a second NOR circuit inputting the output of said second delay circuit and said first data line as inputs;

third and fourth NOR circuits each connected to the output on said first and second NOR circuits of said latch circuit and to said first and second data lines; and first and second NAND circuits to which a write command signal and the output of said third and fourth NOR circuits is each inputted.

* * * * *